United States Patent
Totsuka

[11] Patent Number: 6,130,532
[45] Date of Patent: Oct. 10, 2000

[54] INDICATOR MOVEMENT

[75] Inventor: Shigeki Totsuka, Shizuoka, Japan

[73] Assignee: Yazaki Corporation, Tokyo, Japan

[21] Appl. No.: 09/385,629

[22] Filed: Aug. 27, 1999

[30] Foreign Application Priority Data

Sep. 1, 1998 [JP] Japan .................................. 10-246665

[51] Int. Cl.$^7$ .............................. G01R 5/16; H02K 3/04
[52] U.S. Cl. ........................ 324/146; 310/194; 310/257; 310/71; 310/254
[58] Field of Search .................................. 310/194, 257, 310/254, 71, 184, 49 R; 324/146, 147, 151 R; 968/493

[56] References Cited

U.S. PATENT DOCUMENTS

| | | | |
|---|---|---|---|
| 2,978,639 | 4/1961 | Lawson | 324/146 |
| 4,186,322 | 1/1980 | Besson | 310/194 |
| 4,492,920 | 1/1985 | Reenstra | 314/146 |
| 4,831,293 | 5/1989 | Krop | 310/49 R |
| 5,578,918 | 11/1996 | Baatz | 324/146 |
| 5,646,466 | 7/1997 | Noji et al. | 310/112 |
| 5,686,832 | 11/1997 | Ayres et al. | 324/146 |

FOREIGN PATENT DOCUMENTS

| | | |
|---|---|---|
| 0 341 079 | 11/1989 | European Pat. Off. . |
| 59-23224 | 2/1984 | Japan . |
| 3-78268 | 8/1991 | Japan . |
| 3-110373 | 11/1991 | Japan . |
| 3002323 | 7/1994 | Japan . |

*Primary Examiner*—Nicholas Ponomarenko
*Assistant Examiner*—Karl E. Tamai
*Attorney, Agent, or Firm*—Armstrong, Westerman, Hattori, McLeland & Naughton

[57] ABSTRACT

The movement has a rectangular section case for accommodating a magnet rotor so as to turnably support the magnet rotor engaged with a pointer spindle. A pair of inner core bobbins wound by an electrical wire each are slidingly engaged with the case through the rectangular opening so as to be opposed to each other. A pair of outer bobbins wound by an electrical wire each are slidingly engaged with the pair of inner core bobbins through a rectangular opening of each outer bobbin so as to be opposed to each other. Each of inner and outer bobbins may have an outer frame plate which has a pair of electrical terminals at the middle thereof. The pair of terminals may consist of upper and lower terminals. The outer frame plate may be provided with a terminal retainer for securing the pair of terminals.

6 Claims, 5 Drawing Sheets

INDICATOR MOVEMENT

BACKGROUND OF THE INVENTION

1. Field of the Invention

The present invention relates to a movement used in an indication gauge provided in vehicles, aircraft, ships, etc.

2. Prior Art

There have been used a large number of conventional indication gauges having a movement device with a pair of cross coils generating magnet fields which are perpendicular to each other. The pair of coils each receiving a current varying with a measurement value generate the magnet fields. The combination of the magnet fields turns a magnet rotor fitted with a pointer. The pointer turns together with the magnet rotor to indicate the measured value.

FIG. 4 is an explanatory illustration showing a conventional indication gauge having a movement with a pair of cross coils. FIG. 5 is an enlarged explanatory illustration of the movement. FIG. 6A is s a general explanatory illustration showing mutually crossing inner and outer coils, and FIG. 6B is a general explanatory illustration showing an inner coil wound on a coil bobbin body.

Referring to FIGS. 4 to 6, an indicator movement having conventional cross coils and an indication gauge provided with such a movement device will be discussed hereinafter.

As shown in FIGS. 4 and 5, an indication gauge 100 has a movement 103 received in a shielding case 111. The case 111 accommodates a coil bobbin 104 wound with a pair of cross coils 105 consisting of an inner coil 105a and an outer coil 105b. The coil bobbin 104 has an upper cover 104a, a lower cover 104b, a flange 104c, a boss 104d, and a magnet rotor receiving chamber 104e. The rotor receiving chamber 104e is a space defined between the upper cover 104a and the lower cover 104b, in which there is turnably provided a disc magnet rotor 106 having a pointer spindle 107 engaged therewith. The upper cover 104a and the lower cover 104b are put together with securing screws 113. The joined upper and lower covers 104a, 104b, as shown in FIGS. 6A and 6B, constitute a coil bobbin 104 wound by a pair of inner and outer coil 105a, 105b which cross each other. In FIG. 6, denoted 104a is an upper cover.

The securing screws 113 serve also as terminals connected to the cross coils 105. Four securing screws 113 are spaced at a normal angle in perpendicular to the pointer spindle 107. Each securing screws 113 has an upper end coupled to a lead of the inner coil 105a or the outer the coil 105b. Meanwhile, in a lower end side of the securing screws, there is provided a printed circuit board 112. The printed circuit board 112 has a circuit pattern (not shown) for supplying electric current supplied from a control section. The printed circuit board 112 is secured to the securing screws 113, which electrically connects the circuit pattern to the securing screws 113.

In a central portion of the upper cover 104a, a generally circular boss 104d is provided outside the cross coils 105. The boss 104d has a small hole at the center thereof. The small hole turnably receives the pointer spindle 107 engaged with the magnet rotor 106.

The coil bobbin 104 has a pair of flanges 104c radially symmetrically extended at an upper side thereof. The flanges 104c compose abaseto fit an indication board 102 consisting of a dial board 114 and a light guiding plate 116. The indication board 102 is secured to the flanges 104c with securing screws 115. The indication board 102 has a through hole for the pointer spindle 107 extending therefrom.

The pointer 117 has a tapered main body 117a and a cap 117b joined to a pivot center of the main body 117a. At the pivot center, the cap 117b is engaged with an upper end portion of the pointer spindle 107 extending through the indication board 102. The dial board 114 has a printed scale for indicating a value of objective information. Denoted 108 is a hairspring for resiliently biasing the pointer 117.

The coil bobbin may be a movement consisting of a main case for receiving the magnet rotor and coil cores positioned so as to surround the rotor main case and wound with coiled wires. The coil cores are disposed in perpendicular to the rotormain case. In FIG. 7, there is shown such a conventional movement. In FIG. 8, another conventional movement is shown, and FIG. 9 shows a further other conventional movement.

For example, Japanese Utility Model Application Laid-open No. H. 3-110373 discloses an indicator movement having a movable magnet. As shown in FIG. 7, the movement has a housing 21 consisting of an upper cover 21a and a horizontally rectangular case 21b accommodating a magnet rotor. The case 21b has four side faces each fitted with a coil bobbin 26a wound by an electrical wire defining a coil 26 by bonding or the like.

Japanese Utility Model Application Laid-open No. H. 3-78268 discloses an indicator movement as shown in FIG. 8. The movement has a case 31 accommodating a circular plate shaped rotary magnet 38. Around the rotary magnet 38, there are disposed four generally circular coil bodies 36 or 37 circumferentially spaced from each other at a right angle in the case 31. The coil bodies 36, 37 each are wound with a copper wire 33 and each receive an outer rubber ring 34. The coil bodies 36, 37 are disposed in such a way that their central axes each are directed in a radial direction of the rotary magnet 38. The coil bodies 36, 37 each may have a leg for securing a bottom plate of the case 31 by soldering. The leg serves also as an electrical terminal of the coil bodies 36, 37.

Japanese Utility Model Registered No. 3002323 discloses an indicator movement as shown in FIG. 9. The movement has an upper seat 41 and a lower seat 42 for accommodating a rotary magnet therebetween. Around the magnet, there are disposed four bobbins 43 each wound with an electrical wire defining a coil 45. The bobbins 43 are secured to the upper and lower seats 41, 42 via tenons 411, 421 each extending from an outer side face of the upper and lower seats 41, 42. A pair of the tenons 411, 421 pass through an opening 44 formed in each bobbin 43. The tenons 411, 421 each have a fore end hook to lock it an edge of the bobbin opening 44.

However, the movement 103 having the conventional cross coils 105 shown in FIGS. 4 to 6 includes a disadvantage that it is a difficult work to evenly tightly wind electrical wires on the coil bobbin 104 to define the cross coils 105. That is because chuck tools for holding the coil bobbin 104 interfere with correct winding of electrical wires on the coil bobbin 104 to define coils. The movement 103 includes the pointer spindle 107 extending outward from the boss 104d disposed on the central portion of the upper cover 104a of the coil bobbin 104. The boss 104d with the pointer spindle 107 also interferes with winding of electrical wires on the coil bobbin 104, causing such damage as break or insulation stripping-off of the coiled wires. This may present an incorrect condition of the movement 103. Furthermore, the movement 103 has a complicated structure, which requires a skilled person for assembling thereof.

The movement shown in FIG. 7 includes the rectangular bobbin 21 having four side faces each fitted with the cylindrical coil bobbin 26a having the coil 26. The different conventional movement shown in FIG. 8 has the generally cylindrical coil assemblies 36, 37 disposed outside the rotary magnet 38 in the case 31. The further different conventional movement shown in FIG. 9 has the coupled upper and lower seats 41, 42 accommodating the magnet rotor, and on each of the four side faces of the coupled seat, there is fitted the bobbin 43 having the coil 45. These conventional movements shown in FIGS. 7 to 9 each have a main case accommodating a magnet rotor and coil bobbins with coils disposed outside the main case. Thus, each of the assembled movements includes vacant spaces, disadvantageously causing an enlarged dimension thereof.

SUMMARY OF THE INVENTION

An object of the present invention is to eliminate the disadvantages described of the prior arts.

That is, the present invention provides an indicator movement in which electrical wires can be wound evenly tightly on coil bobbins to define coils without a damage of the wires. The winding of the coils requires no elaborate work. The movement is compact in size and has a configuration which is easily assembled.

For achieving the object, a first aspect of the present invention is an indicator movement which includes a rectangular cross-section case for accommodating amagnet rotor so as to turnably support said magnet rotor engageable with a pointer spindle of the indicator, a pair of inner core bobbins each having a conductor coil wound thereon and a rectangular opening provided in an axial direction thereof, and a pair of outer core bobbins each having a conductor coil wound thereon and a rectangular opening provided in an axial direction thereof, wherein, the pair of inner core bobbins each are slidingly engaged with said case through the rectangular opening of the inner core bobbin so as to be opposed to each other, and the pair of outer core bobbins each are slidingly engaged with the pair of inner core bobbin through the rectangular opening of the outer core bobbin so as to be opposed to each other.

A second aspect of the present invention is a movement described in the first aspect, wherein the inner bobbins and outer bobbins each have an outer frame plate having two pairs of electrical terminals at a middle part of the outer frame plate.

A third aspect of the present invention is a movement described in the first aspect, wherein a pair of the terminals are directed upward and the other pair of terminals are directed downward.

A fourth aspect of the present invention is a movement described in the second aspect, wherein the outer frame plate is provided with a terminal retainer for securing the pairs of terminals.

Preferably, the inner and outer bobbins each have a diameter progressively smaller toward outside.

Now, advantages of the present invention will be discussed.

In the movement according to the first aspect of the invention, the inner and outer coil bobbins are simply separately wound with coils in a sub-assembling stage, thereby enabling to evenly tightly wind electrical wires on the coil bobbins without any damage of the coils. Thus assembled movement arises no wrong condition such as a short circuit to provide stably a correct indication. Moreover, a number of coil bobbins each having a coil are continuously effectively fabricated. In addition, the movement is compact in size and has a configuration which can be easily assembled.

In the second aspect of the invention, the terminal retainers each are arranged in the middle of the outer frame plate of the inner and core bobbin, enabling easy mounting of the inner and outer core bobbins.

In the third aspect of the invention, the upper terminals will be connected to the coil while the lower terminals will be connected to a circuit board. This terminal arrangement enables an easy connection work of the terminals.

In the fourth aspect of the invention, there is an advantage that the terminals can be firmly disposed on the terminal retainer.

DETAILED DESCRIPTION OF THE PREFERRED EMBODIMENT

Figure 1A:
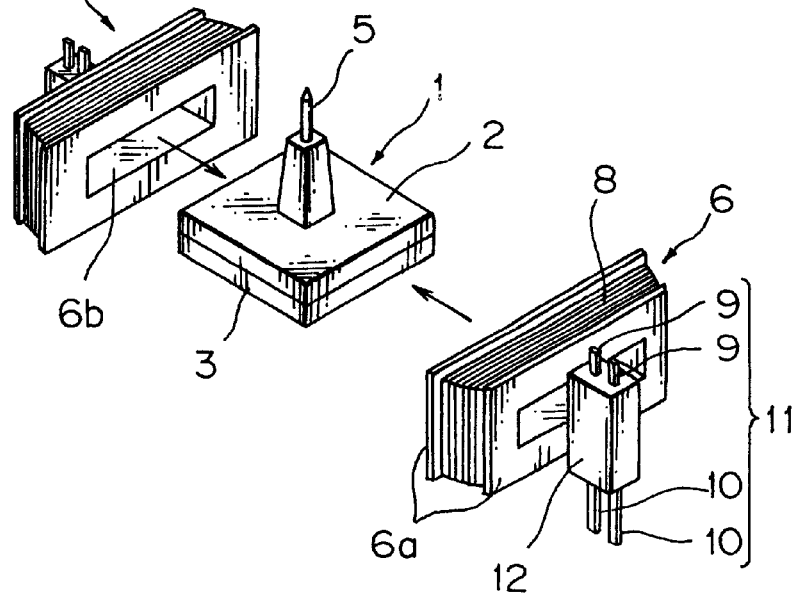
FIGS. 1A and 1B are explanatory illustrations of an indicator movement of an embodiment of the present invention, FIG. 1A showing a step for assembling a pair of inner core bobbins on a magnet rotor case, FIG. 1B showing a step for assembling a pair of outer core bobbins on the inner core bobbins.
Figure 1B:
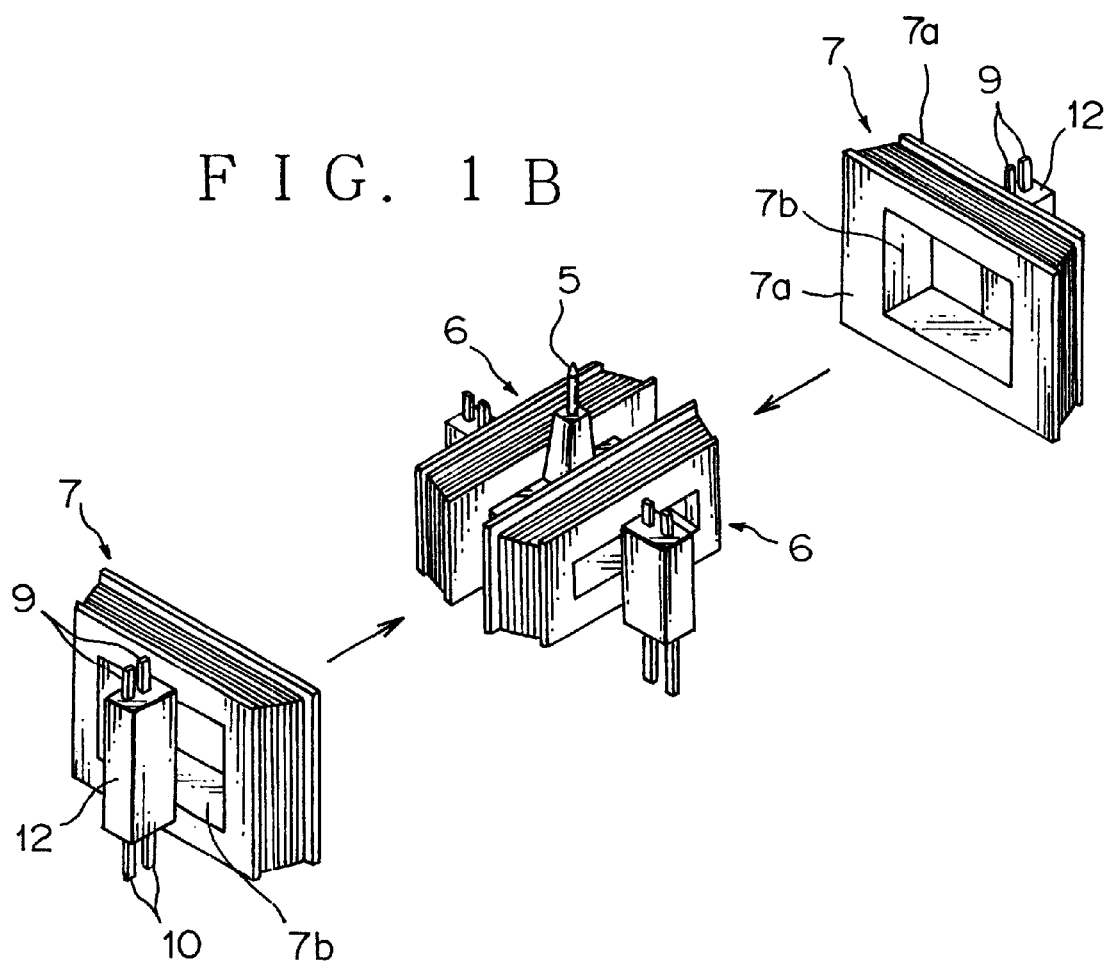
Figure 2:
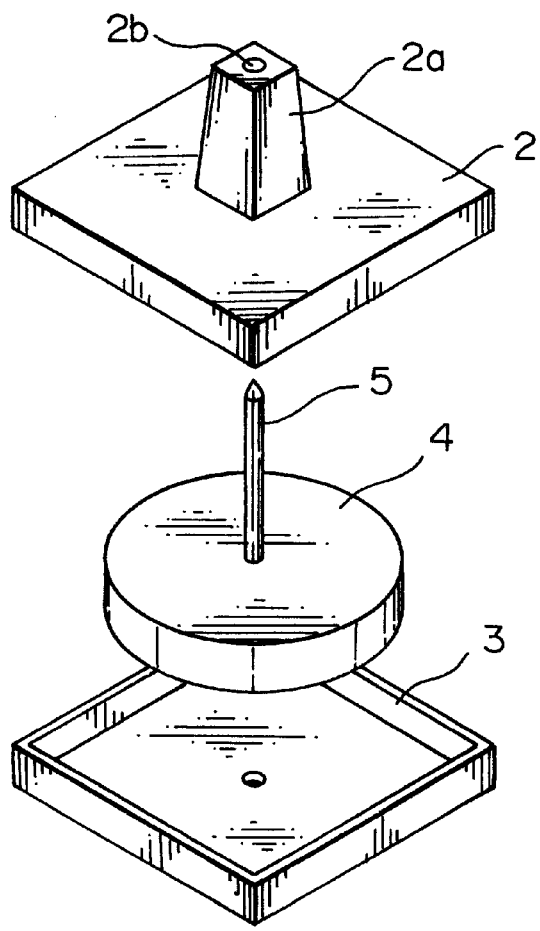
FIG. 2 is an exploded perspective view showing the magnet rotor case.
Figure 3:
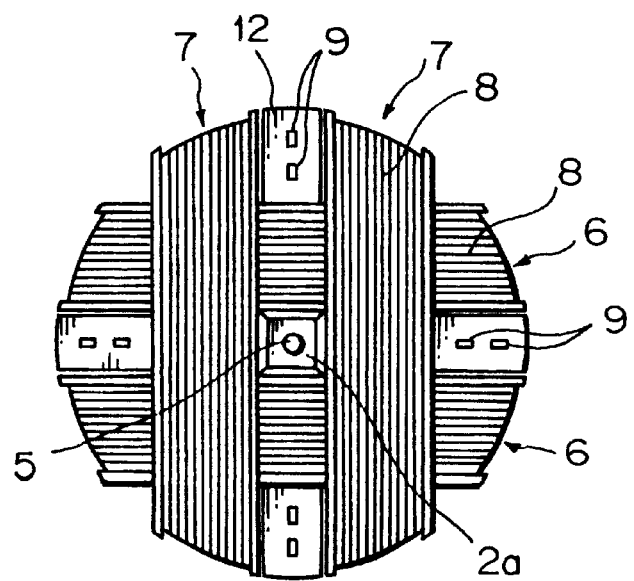
FIG. 3 is a plan view showing the assembled movement.
Figure 4:
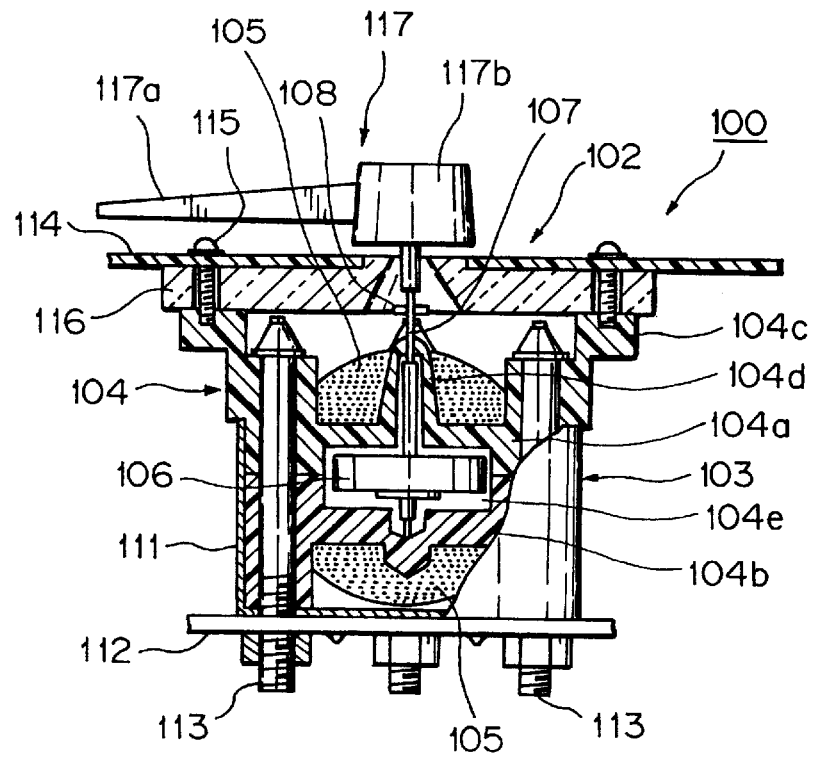
FIG. 4 is an explanatory illustration showing a conventional indication gauge having a movement with a pair of cross coils.
Figure 5:
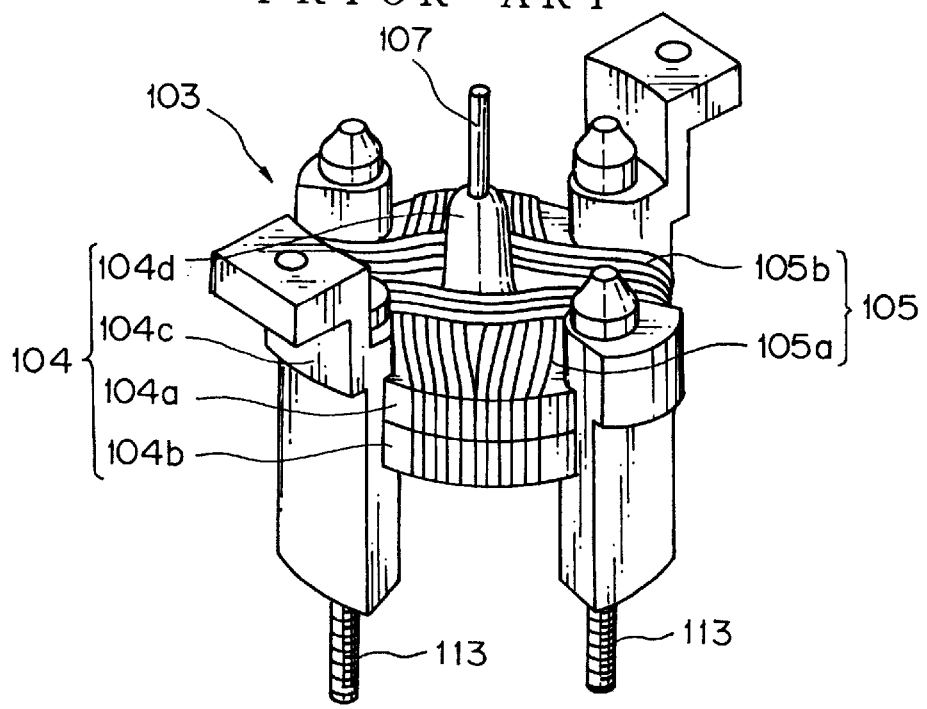
FIG. 5 is an enlarged explanatory illustration of the movement of FIG. 4.
Figure 6A:
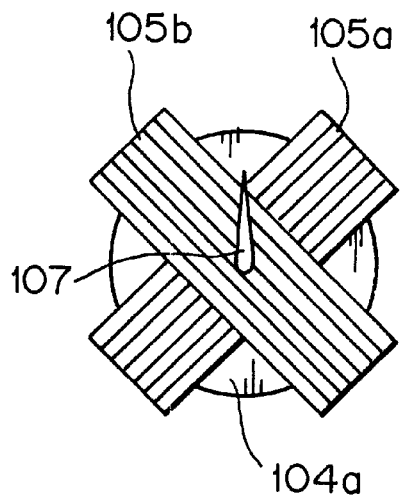
FIG. 6A is a general explanatory illustration showing mutually crossing inner and outer coils.
Figure 6B:
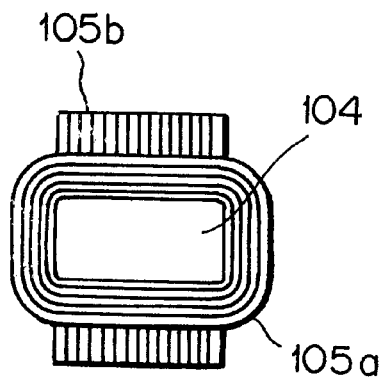
FIG. 6B is a general explanatory illustration showing an inner coil wound on a coil bobbin body.
Figure 7:
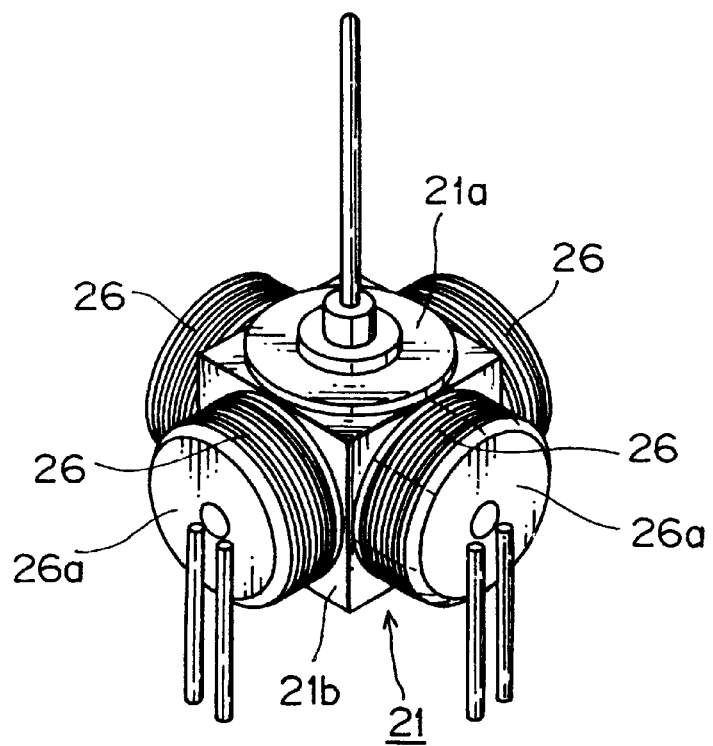
FIG. 7 is an exploded perspective view showing an conventional movement which has a magnet rotor receiving case and coil bobbins spaced from each other at a normal angle.
Figure 8:
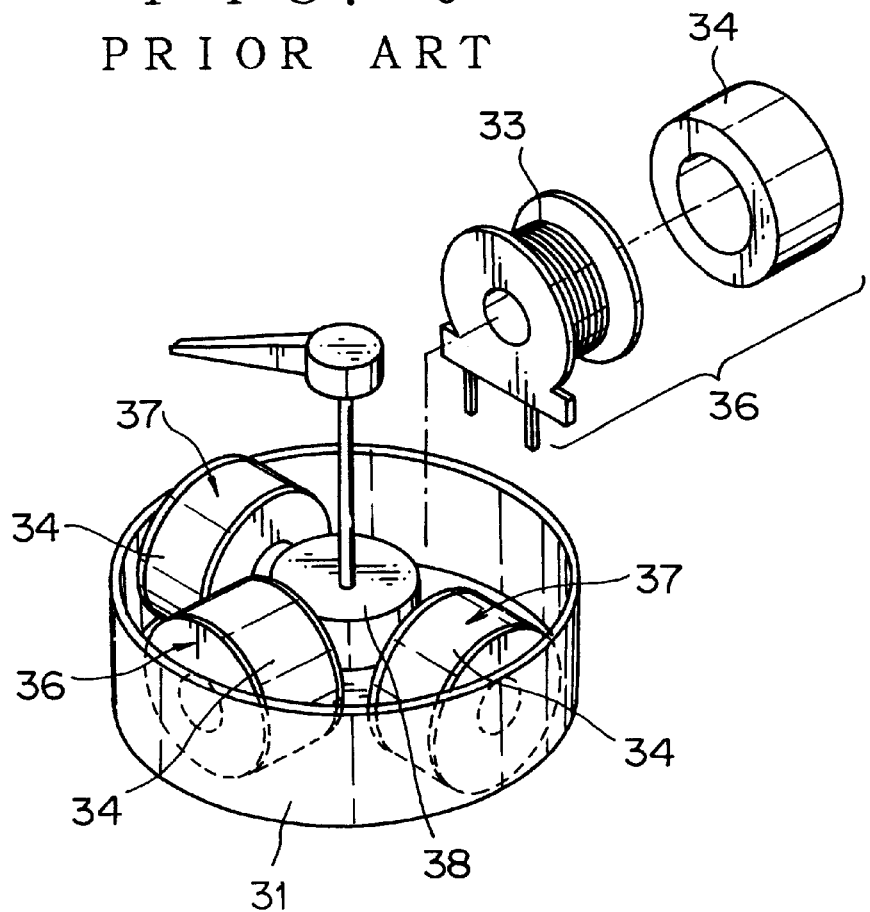
FIG. 8 is an exploded perspective view showing another conventional movement.
Figure 9:
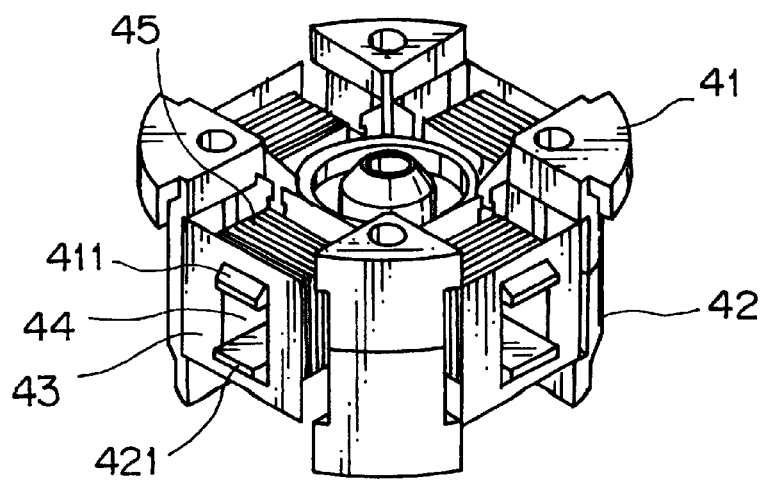
FIG. 9 is a perspective view showing a further other movement.

Referring to FIGS. 1 to 3, an embodiment of the present invention will be discussed.

A movement, as shown in FIGS. 1 to 3, has a rectangular section case 1 turnably accommodating a magnet rotor 4 engaged with a pointer spindle 5, a pair of inner core bobbins 6, 6 each provided with an opening 6b rectangular in section, and a pair of outer core bobbins 7, 7 each provided with a rectangular opening 7b. The case 1 consists of an upper cover 2 and a lower cover 3. The upper cover 2 is fitted with a boss 2a at the center thereof. The boss 2a has a central small hole 2b through which a pointer spindle 5 engaged with the magnet rotor 4 passes turnably.

These elements will be assembled in the following manner. The pair of inner core bobbins 6, 6 wound with coils 8 each slidingly engage with the case 1 through the rectangular opening 6b so as to hold the case 1 therebetween. Next, the pair of outer core bobbins 7, 7 wound with coils 8 each slidingly engage with the pair of inner core bobbins 6, 6 through the rectangular opening 7b so as to hold the inner core bobbins therebetween.

Thus, the inner core bobbins 6, 6 each with the coil 8 and the outer core bobbins 7, 7 with each the coil 8 are set to surround the case1 to define a cross coil assembly. That is, the inner and outer coil bobbins are separately wound with coils, thereby enabling to evenly tightly wind electrical wires on the coil bobbins without any damage of the coils.

Each inner core bobbin 6 has a pair of end frame plates 6a, 6a, and each outer core bobbin 7 has a pair of end frame plates 7a. The frame plates 6a, 7a each have a terminal body 11 which preferably includes upper terminals 9, 9 and lower terminals 10, 10 in the middle thereof. This arrangement of the terminal bodies 11 on the frame plates 6a, 7a does not interfere with mounting of the inner and outer core bobbins 6, 7. Preferably, the terminal body 12 and terminal retainer 9 are integrally formed by injection molding of a synthetic resin. The upper terminals 9, 9 are connected to the coil 8, and the lower terminals 10, 10 are connected to a circuit board (not shown).

The assembled movement, as shown in FIG. 3, requires little vacant space, allowing a compact device. That is, the elements including the rectangular cover 2, the boss 2a, the inner core bobbins 6, 6, the outer core bobbins 7, 7, and the terminal retainers 9 allow a compact movement.

What is claimed is:

1. An indicator movement comprising a rectangular cross-section case for accommodating a magnet rotor so as to turnably support said magnet rotor engageable with a pointer spindle of the indicator, a pair of inner core bobbins each having a conductor coil wound thereon and a rectangular opening provided in an axial direction thereof, and a pair of outer core bobbins each having a conductor coil wound thereon and a rectangular opening provided in an axial direction thereof, wherein, the pair of inner core bobbins each are slidingly engaged with said case through the rectangular opening of the inner core bobbin so as to be opposed to each other, and the pair of outer core bobbins each are slidingly engaged with the pair of inner core bobbin through the rectangular opening of the outer core bobbin so as to be opposed to each other.

2. The movement as set forth in claim 1, wherein the inner bobbins and outer bobbins each have an outer frame plate having two pairs of electrical terminals at a middle part of the outer frame plate.

3. The movement as set forth in claim 1, wherein a pair of the terminals are directed upward and the other pair of terminals are directed downward.

4. The movement as set forth in claim 2, wherein the outer frame plate is provided with a terminal retainer for securing the pairs of terminals.

5. The movement as set forth in claim 1, wherein the pair of inner core bobbins each have a diameter progressively smaller toward outside.

6. The movement as set forth in claim 5, wherein the pair of outer core bobbins each have a diameter progressively smaller toward outside.

* * * * *